United States Patent
Igarashi et al.

(10) Patent No.: US 6,883,231 B2
(45) Date of Patent: *Apr. 26, 2005

(54) METHOD FOR FABRICATING A CIRCUIT DEVICE

(75) Inventors: Yusuke Igarashi, Gunma (JP); Noriaki Sakamoto, Gunma (JP); Yoshiyuki Kobayashi, Gunma (JP); Takeshi Nakamura, Gunma (JP)

(73) Assignee: Sanyo Electric Co. Ltd., Osaka (JP)

( * ) Notice: Subject to any disclaimer, the term of this patent is extended or adjusted under 35 U.S.C. 154(b) by 272 days.

This patent is subject to a terminal disclaimer.

(21) Appl. No.: 10/171,923

(22) Filed: Jun. 14, 2002

(65) Prior Publication Data

US 2003/0054659 A1 Mar. 20, 2003

(30) Foreign Application Priority Data

Jun. 19, 2001 (JP) ...................................... P. 2001-185421

(51) Int. Cl.⁷ ................................................ H05K 3/34
(52) U.S. Cl. ............................ 29/840; 29/843; 29/842; 29/841; 29/832; 29/852; 438/126
(58) Field of Search ......................... 29/843, 842, 841, 29/840, 593, 592.1, 852, 830, 846, 829; 438/126, 127, 121, 124, 125; 174/52.1, 52.2; 257/773, 778; 264/272.17; 427/97

(56) References Cited

U.S. PATENT DOCUMENTS

| | | | | | |
|---|---|---|---|---|---|
| 5,832,600 | A | * | 11/1998 | Hashimoto | .................... 29/841 |
| 6,119,335 | A | * | 9/2000 | Park et al. | ..................... 29/830 |
| 6,664,138 | B1 | * | 12/2003 | Igarashi et al. | ............. 438/126 |
| 6,720,209 | B1 | * | 4/2004 | Igarashi et al. | ............. 438/126 |

* cited by examiner

*Primary Examiner*—Minh Trinh
(74) *Attorney, Agent, or Firm*—Fish & Richardson PC

(57) ABSTRACT

A method for fabricating a circuit device includes preparing an insulation resin sheet for which a first conductive layer and a second conductive layer are adhered to each other by insulation resin, forming through holes in the first conductive layer and the insulation resin at appointed points of the insulation resin sheet, and selectively exposing the rear side of the second conductive layer. A multi-layer connecting means is formed in the through holes and the first conductive layer is electrically connected to the second conductive layer. The method includes etching the first conductive layer to an appointed pattern, forming a first conductive path layer, and adhering and fixing semiconductor elements by electrically insulating the same on the first conductive path layer. The first conductive path layer and the semiconductor elements are overcoated with a sealing resin layer. The second conductive layer is etched to an appointed pattern after etching the entire surface thereof so as to become thin, and forming a second conductive path layer. External electrodes are formed at appointed points of the second conductive path layer.

18 Claims, 9 Drawing Sheets

METHOD FOR FABRICATING A CIRCUIT DEVICE

BACKGROUND OF THE INVENTION

1. Field of the Invention

The present invention relates to a method for fabricating a circuit device, and in particular, a method for fabricating a thin type circuit device, using two conductive layers, which is able to achieve multi-layered connection.

2. Description of the Prior Arts

Recently, IC packages have been actively employed in portable devices, and small-sized and high density assembly devices. Conventional IC packages and assembly concepts tend to greatly change. For example, this is described in, for example, Japanese Laid-Open Patent Publication No. 2000-133678. This pertains to a technology regarding a semiconductor apparatus in which a polyimide resin sheet being a flexible sheet is employed as one example of insulation resin sheets.

FIG. 13 through FIGS. 15A,15B and 15C show a case where a flexible sheet 50 is employed as an interposer substrate. Also, the views illustrated upside of the respective drawings are plan views, and the views illustrated downside thereof are longitudinally sectional views taken along the lines A—A of the respective drawings.

First, copper foil patterns 51 are prepared to be adhered to each other via an adhesive resin on the flexible sheet 50 illustrated in FIG. 13. These copper foil patterns 51 have different patterns, depending upon cases where a semiconductor element to be assembled is a transistor or an IC. Generally speaking, a bonding pad 51A and an island 51B are formed. Also, an opening 52 is provided to take out an electrode from the rear side of the flexible sheet 50, from which the above-described copper foil pattern 51 is exposed.

Subsequently, the flexible sheet 50 is transferred onto a die bonder, and as shown in FIG. 14, a semiconductor element 53 is assembled or mounted. After that, the flexible sheet 50 is transferred onto a wire bonder, wherein the bonding pads 51A are electrically connected to the pads of the semiconductor elements 53 by thin metal wires 54.

Finally, as shown in FIG. 15A, sealing resin 55 is provided on the surface of the flexible sheet 50, and the surface thereof is completely sealed with the sealing resin 55. Herein, the bonding pads 51A, island 51B, semiconductor elements 53 and thin metal wires 54 are transfer-molded so as to be completely overcoated.

After that, as shown in FIG. 15B, connecting means 56 such as solder and a soldering ball is provided, wherein spherical solder 56 deposited to the bonding pad 51A is formed via the opening 52 by passing through a solder reflow furnace. Further, since semiconductor elements 53 are formed in the form of a matrix on the flexible sheet 50, these are diced to be separated from each other as shown in FIG. 14.

In addition, the sectional view of FIG. 15C shows electrodes 51A and 51D on both sides of the flexible sheet 50 as the electrodes. The flexible sheet 50 is generally supplied from a maker after both sides thereof are patterned.

Since a semiconductor apparatus that employs the above-described flexible sheet 50 does not utilize any publicly known metal frame, the semiconductor apparatus has a problem in that a multi-layer connection structure cannot be achieved while it has an advantage by which a remarkably thin package structure can be brought about, wherein path is carried out with one layer of copper foil pattern 51, which is provided substantially on the surface of the flexible sheet 50.

It is necessary to make the flexible sheet 50 sufficiently thick, for example, approx. 200 $\mu$m, in order to retain supporting strength to achieve a multi-layer connection structure. Therefore, there is a problem of retrogression with respect to thinning of the sheet.

Further, in the method for fabricating a circuit device, a flexible sheet 50 is transferred in the above-described fabrication apparatus, for example, a die bonder, wire bonder, a transfer mold apparatus, and a reflow furnace, etc., and the flexible sheet 50 is attached onto a portion called a "stage" or a "table".

However, if the thickness of the insulation resin that becomes the base of the flexible sheet 50 is made thin, for example, 50 $\mu$m, the flexible sheet 50 may be warped as shown in FIG. 16 or its transfer performance may be remarkably worsened where the thickness of the copper foil pattern 51 formed on the surface thereof is thin to be 9 through 35 $\mu$m. In addition, another problem arises in that the flexible sheet 50 is defectively attached to the above-described stage or table. This is because it is considered that the resin is warped since the insulation resin itself is very thin, and the resin is warped due to a difference in the thermal expansion coefficient between the copper foil pattern 51 and the insulation resin. Particularly, if a hard insulation material in which no glass cloth fibers are used as a core material is warped as shown in FIG. 16, there was a problem in that the insulation material could easily collapse due to compression from above.

Since the portion of the opening 52 is compressed from above when being molded, a force by which the periphery of the bonding pad 51A is warped upward is brought about, the adhesion of the bonding pad 51A is worsened.

Also, the resin material that constitutes a flexible sheet 50 has less flexibility, or if a filler to increase the thermal conductivity is blended, the flexible sheet 50 is made hard. In such a case, where bonding is carried out by a wire bonder, there may be a case where the bonded portion is cracked. Also, when performing transfer molding, there is a case where the portion with which a metal die is brought into contact is cracked. This remarkably occurs if any warping shown in FIG. 16 is provided.

Although the flexible sheet 50 described above is such a type that no electrode is formed on the rear side thereof, there are cases where an electrode 51D is formed on the rear side of the flexible sheet 50 as shown in FIG. 15C. At this time, since the electrode 51D is brought into contact with the above-described fabrication apparatus or is brought into contact with the transfer plane of transfer means between the fabrication apparatuses, another problem occurs in that damage and scratches arise on the rear side of the electrode 51D, wherein the electrode is established with such damage and scratches retained, the electrode 51 itself may be cracked due to application of heat later on.

Also, if an electrode 51D is provided on the rear side of the flexible sheet 50, a problem occurs in that, when carrying out transfer molding, no facial contact with the stage can be secured. In this case, if the flexible sheet 50 is composed of a hard material as described above, the electrode 51D becomes a fulcrum and the periphery of the electrode 51D is compressed downward, wherein the flexible sheet 50 is cracked.

The present inventor proposed use of an insulation resin sheet for which the first thin conductive layer and the second thick conductive layer are adhered by insulation resin.

However, although the first conductive layer, which is thin, is finely patterned in achieving a multi-layer connection structure, there is a problem in that the second conductive layer, which is thick, is not suitable for fine patterning.

SUMMARY OF THE INVENTION

A method for fabricating a circuit device according to the invention comprises the steps of: preparing an insulation resin sheet in which the first conductive layer and the second conductive layer are adhered to each other by insulation resin; forming through holes in the above-described first conductive layer and the above-described insulation resin at an appointed point of the above-described insulation resin sheet, and selectively exposing the rear side of the above-described second conductive layer; forming multi-layer connecting means in the above-described through holes and electrically connecting the above-described first conductive layer and the above-described second conductive layer to each other; forming a first conductive path layer by etching the above-described first conductive layer to an appointed pattern; electrically insulating a semiconductor element and adhering and fixing the above-described semiconductor element on the above-described first conductive path layer; overcoating the above-described first conductive path layer and the above-described semiconductor element with a sealing resin layer; forming the second conductive path layer to an appointed pattern by etching the above-described second conductive layer so as to make the entire surface thereof thin; and forming an external electrode at an appointed point of the above-described second conductive path layer.

Since the flexible sheet is formed to be thick by the first conductive layer and the second conductive layer, the flatness of a sheet-shaped circuit substrate can be maintained even if the insulation resin is thin.

Before the step of overcoating the first conductive path layer and semiconductor elements by a sealing resin layer, the mechanical strength of the first conductive path layer and semiconductor elements is retained by the second conductive layer. After that, the mechanical strength is retained by the sealing resin layer. Therefore, it is possible to easily form the second conductive path layer by the second conductive layer. As a result, the insulation resin does not need any mechanical strength, wherein it is possible to make the insulation resin thin to the thickness by which electrical insulation can be maintained.

Further, since the lower die mold and planes of a transfer molding apparatus are brought into contact with the entirety of the second conductive layer, no local compression is brought about, and it is possible to prevent the insulation resin from being cracked.

Still further, since the first conductive layer can form the first conductive path layer after a multi-layer connecting means is formed in through holes, the multi-layer connecting means can be formed without any mask.

Still further, since the second conductive path layer is made thin and patterned by etching the second conductive layer, it becomes possible to achieve a fine pattern of the second path layer.

The method according to the invention has the following advantages.

First, warping of an insulation resin sheet can be prevented by the second conductive layer until a substrate is molded by a sealing resin layer, and transfer performance thereof can be improved.

Second, since a through-hole, which is formed in an insulation resin, is prepared by a carbonic acid gas laser, plating for multi-layer connecting means can be carried out immediately thereafter, the process can be made remarkably simple. Also, if copper plating is used as the multi-layer connecting means, the first conductive layer and the second conductive layer can be made of the same material (copper) the processes after that can be made simple.

Third, since the multi-layer connecting means is achieved by a plated layer, the multi-layer connecting means can be formed without any mask before the first conductive path layer is formed. Since patterning can be performed simultaneously with the formation of the first conductive path layer, it becomes remarkably simple to form the multi-layer connecting means.

Fourth, since the mechanical support of the insulation resin sheet is retained by the second conductive layer until the sealing resin layer is formed, and the mechanical support of the insulation resin sheet is retained by the sealing resin layer after the second conductive path layer is formed, the mechanical strength of the insulation resin is disregarded, wherein a remarkably thin assembly method can be achieved.

Fifth, since both sides of the insulation resin are covered by the first and second conductive layer even where the insulation resin itself is hard or becomes hard by a filler being blended therein, flatness of the insulation resin sheet itself can be increased in the fabrication process, and it is possible to prevent cracks from occurring.

Sixth, since the insulation resin sheet has a second conductive layer thickly formed on its rear side, the insulation resin sheet can be utilized as a support substrate for die bonding of chips and for sealing a wire bonder and semiconductor elements In addition, where the insulation resin material itself is soft, propagation of energy for wire bonding can be improved, and the wire bondability can be further improved.

Seventh, since the second conductive layer is etched so that the thickness thereof can be reduced in half after the sealing resin layer is molded, it is possible to achieve a fine pattern of the second conductive path layer, wherein it becomes possible to achieve a circuit device of remarkably fine patterns along with the first conductive path layers.

DESCRIPTION OF THE PREFERRED EMBODIMENTS

A description is given of a method for fabricating a circuit device according to the invention with reference to FIG. 1 through FIG. 12.

A method for fabricating a circuit device according to the invention is featured in that the method comprises the steps of: preparing an insulation resin sheet for which a first conductive layer and a second conductive layer are adhered to each other by insulation resin; forming through holes in the above-described first conductive layer and the above-described insulation resin at appointed points of the above-described insulation resin sheet, and selectively exposing the rear side of the above-described second conductive layer; forming multi-layer connecting means in the above-described through holes and electrically connecting the above-described first conductive layer and the above-described second conductive layer; etching the above-described first conductive layer to an appointed pattern and forming a first conductive path layer; adhering and fixing semiconductor elements by electrically insulating the same on the above-described first conductive path layer; overcoating the above-described first conductive path layer and the above-described semiconductor elements with a sealing resin layer; etching the above-described second conductive layer to an appointed pattern after etching the entire surface thereof so as to become thin, and forming a second conductive path layer; and forming external electrodes at appointed points of the above-described second conductive path layer.

Figure 1:
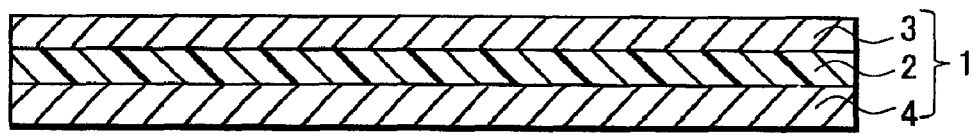
FIG. 1 is a sectional view describing a method for fabricating a circuit device according to the invention.

The first step of the invention prepares an insulation resin sheet 1 in which the first conductive layer 3 and the second conductive layer 4 are adhered to each other by the insulation resin 2 as shown in FIG. 1.

The first conductive layer 3 is formed on substantially the entire surface of the insulation resin sheet 1, and the second conductive layer 4 is formed on substantially the entire rear side thereof. In addition, the material of the insulation resin 2 is an insulation material composed of macromolecules such as polyimide resin or epoxy resin, etc. In addition, the first conductive layer 3 and the second conductive layer 4 are, preferably, mainly composed of copper (Cu), or a publicly known material of a lead frame, and the layer 3 and 4 are coated on the insulation resin 2 by a plating method, a deposition method, or a spattering method, or a metallic foil formed by a rolling method or a plating method may be adhered thereto.

Also, an insulation resin sheet 1 may be formed by a casting method. Hereinafter, a brief description is given of the fabricating method. First, paste-like polyimide resin is coated on the first conductive layer 3 which is like a flat layer, and also, paste-like polyimide resin is coated on the second conductive layer 4 which is like a flat layer. Then, the insulation resin sheet 1 can be fabricated by adhering both of polyimide resin together after these are semi-hardened. Therefore, the insulation resin sheet 1 has an advantage by which it does not require any reinforcement glass cloth fibers.

A characteristic point of the invention resides in that the second conductive layer 4 is made thicker than the first conductive layer 3.

The first conductive layer 3 is formed to become 5 through 35 µm thick, so that a fine pattern can be fabricated by making the layer 3 as thin as possible. The second conductive layer 4 may be formed to become 70 through 200 µm thick, wherein emphasis is placed on the supporting strength.

Therefore, the flatness of the insulation resin sheet 1 can be maintained by forming the second conductive layer 4 thicker than the layer 3, wherein workability of subsequent processes can be improved, and it becomes possible to prevent the insulation resin 2 from being cracked or to prevent cracks from being brought about.

Further, the second conductive layer 4 may be subjected to being damaged through the various steps. However, since the second conductive layer 4, which is thick, is made thin and is patterned, it is possible to eliminate damage and scratches. In addition, since sealing resin can be hardened while maintaining the flatness, the rear side of a package can be made flat, electrodes that are formed on the rear side of the insulation resin sheet 1 can be arrayed to be flat, whereby electrodes on an assembly substrate can be brought into contact with those on the rear side of the insulation resin sheet 1, and soldering defectives can be prevented from occurring.

Polyimide resin, epoxy resin, etc., are preferably used as the insulation resin 2. In the case of a casting method in which paste-like resin is coated to fabricate a sheet, the layer thickness is 10 through 100 µm. Also, in a case of forming the insulation resin 2 as a sheet, a sheet that is available on the market has a minimum thickness of 25 µm. Also, a filler may be blended therein in consideration of thermal conductivity. Glass, Si oxide, aluminum oxide, Al nitride, Si carbide, boron nitride, etc., are considered as materials of the filler.

As described above, the insulation resin 2 may be selected from resin having low thermal resistance, or that having super low thermal resistance, in which the above-described filler is blended, or polyimide resin. These resins may be selectively used, depending upon the characteristics of a circuit device to be formed.

Figure 2:
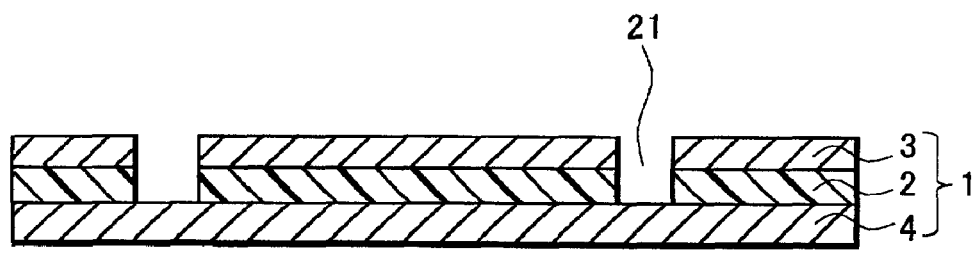
FIG. 2 is a sectional view describing a method for fabricating a circuit device according to the invention.
Figure 3:
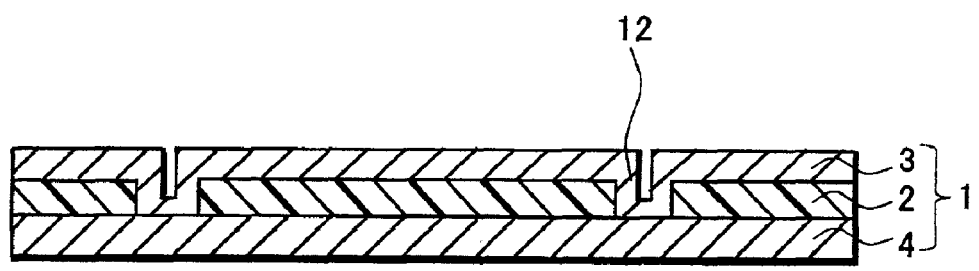
FIG. 3 is a sectional view describing a method for fabricating a circuit device according to the invention.

The second step according to the invention forms through holes 21 in the first conductive layer 3 and the insulation resin 2 at appointed points of the insulation resin sheet 1 as shown in FIG. 2, and selectively exposes the second conductive layer 4.

The entire surface is overcoated with photo-resist with only the portion exposed where the through holes 21 of the first conductive layer 3 are formed. And, the first conductive layer 3 is etched via the photo resist. Since the first conductive layer 3 is composed of Cu as the main material, chemical etching is carried out by using ferric chloride or cupric chloride as the etching solution. Although the opening diameter of the through holes 21 may change depending upon degree of photography resolution, herein, the diameter is 50 through 100 µm or so. Further, when carrying out etching, the second conductive layer 4 is protected from an etching solution by covering the same with an adhesive sheet. However, where the second conductive layer 4 is sufficiently thick and has a thickness by which the flatness can be maintained after etching, the second conductive layer 4 may be slightly etched. In addition, Al, Fe, Fe—Ni or a publicly known lead frame material may be acceptable as the first conductive layer 3.

Subsequently, using the first conductive layer 3 as a mask after removing the photo resist, the insulation resin 2 that is immediately below the through holes 21 is removed by a laser, and the rear side of the second conductive layer 4 is exposed on the bottom of the through holes 21. A carbonic acid gas laser is preferably used as the laser. In addition, where any residue remains on the bottom of the opening portion after the insulation resin is evaporated by the laser, wet etching is carried out, by using permanganic acid soda or persulphuric acid ammonium, in order to remove the residue.

With the step, where the first conductive layer 3 is thin at 10 μm or so, the first conductive layer 3 and the insulation resin 2 are collectively removed by the carbonic acid gas laser after portions other than the through holes 21 are overcoated with photo resist, thereby forming the through holes 21. In this case, a blackening treatment process is required in order to roughen the surface of the first conductive layer 3 in advance.

Figure 5:
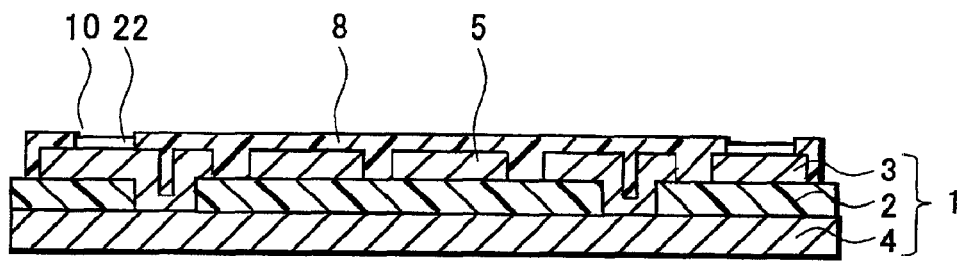
FIG. 5 is a sectional view describing a method for fabricating a circuit device according to the invention.

The third step according to the invention forms multi-layer connecting means 12 in the through holes 21 as shown in FIG. 5, and may electrically connect the first conductive layer 3 and the second conductive layer 4.

A plated layer, which is multi-layer connecting means 12 to permit electric connections between the second conductive layer 4 and the first conductive layer 3, is formed on the entire surface of the first conductive layer 3 including the through holes 21. The plated layer is formed by both non-electrolytic plating and electrolytic plating. Herein, Cu of approx. 2 μm is formed on the entire surface of the first conductive layer 3 including at least the through holes 21 by the non-electrolytic plating, whereby since the first conductive layer 3 and the second conductive layer 4 are electrically made conductive, the electrolytic plating is carried out again by using the first conductive layer 3 and the second conductive layer 4 as electrodes to plate Cu approx. 20 μm thick. Thus, the through holes 21 are filled with Cu, and multi-layer connecting means 12 is thus formed. Also, if EBARA-UDYLITE is employed which is the brand name of a plating solution, it is possible to selectively fill in only the through holes 21. Also, although Cu is employed as the plated layer, Au, Ag, Pd, etc., may be used. Further, partial plating may be acceptable by using a mask.

Figure 4:
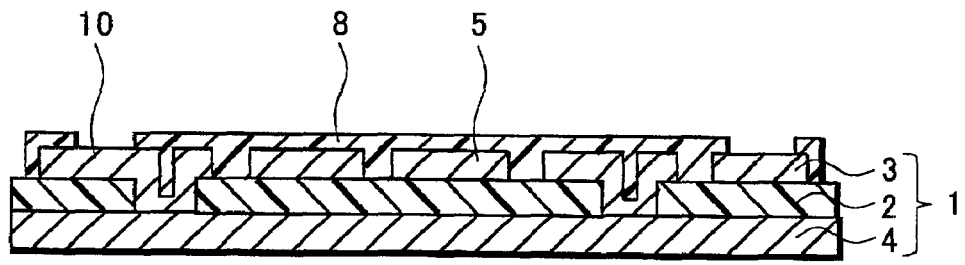
FIG. 4 is a sectional view describing a method for fabricating a circuit device according to the invention.

The fourth step according to the invention forms the first conductive path layer 5 by etching the first conductive layer 3 to an appointed pattern as shown in FIG. 4 and FIG. 5.

The first conductive layer 3 is overcoated with photoresist of an appointed pattern, and the bonding pads 10 and the first conductive path layer 5 extending from these bonding pads 10 to the center of a substrate are formed by chemical etching. Since the first conductive layer 3 is mainly composed of Cu, the etching solution of ferric chloride or cupric chloride may be used for the chemical etching.

Since the first conductive layer 3 is formed to be 5 through 35 μm or so, the first conductive path layer 5 may be formed to be a fine pattern which is smaller than 50 μm.

Continuously, the bonding pads 10 of the first conductive path layer 5 are exposed, and other portions are overcoated with overcoating resin 8. The overcoating resin 8 is such that epoxy resin, etc., is dissolved with a solvent and is adhered by a screen printing method, and is thermally hardened.

Also, as shown in FIG. 5, a plating layer 22 of Au, Ag, etc., is formed on the bonding pads 10 in consideration of the bonding property. The plating layer 22 is selectively adhered, by a non-electrolytic plating method, to the bonding pads 10 using the overcoating resin 8 as a mask.

Figure 6:
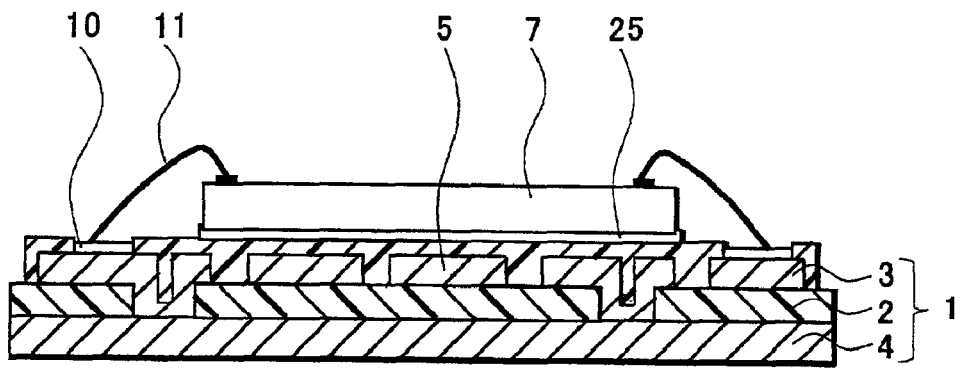
FIG. 6 is a sectional view describing a method for fabricating a circuit device according to the invention.

The fifth step according to the invention adheres and fixes a semiconductor element 7 on the first conductive path layer 5 after being electrically insulated therefrom as shown in FIG. 6.

The semiconductor element 7 is die-bonded on the overcoating resin 8 by insulation adhesion resin 25 as it is a bare chip. Since the semiconductor element 7 is electrically insulated from the first conductive path layer 5 immediately therebelow by the overcoating resin 8, the first conductive path layer 5 can be freely routed below the semiconductor element 7, thereby achieving a multi-layered connection structure.

Also, respective electrode pads 9 of the semiconductor element 7 are connected to the bonding pads 10, which are parts of the first conductive path layer 5 secured at the periphery, by bonding wires 11. The semiconductor elements 7 may be assembled with the faces down. In this case, soldering balls and bumps are provided on the surface of the respective electrodes 9 of the semiconductor elements 7, and electrodes similar to the bonding pads 10 are provided at portions corresponding to the positions of the soldering balls on the surface of the insulation resin sheet 1. (See FIG. 12).

A description is given of the advantages of using the insulation resin sheet 1 when bonding wires. Generally, when bonding Au wires, heating is carried out around 200 through 300° C. At this time, the insulation resin sheet 1 is warped if the second conductive layer 4 is thin. If the insulation resin sheet 1 is compressed via the bonding head in this state, there is a possibility for the insulation resin sheet 1 to be cracked. This remarkably occurs since, if a filler is blended in the insulation resin 2, the material itself becomes hard and flexibility is lost. Also, since resin is softer than metals, energy of compression and ultrasonic waves may be dispersed in the bonding of Au and Al. However, if the insulation resin 2 is made thin and the second conductive layer 4 is formed to be thick, these problems can be solved.

Figure 7:
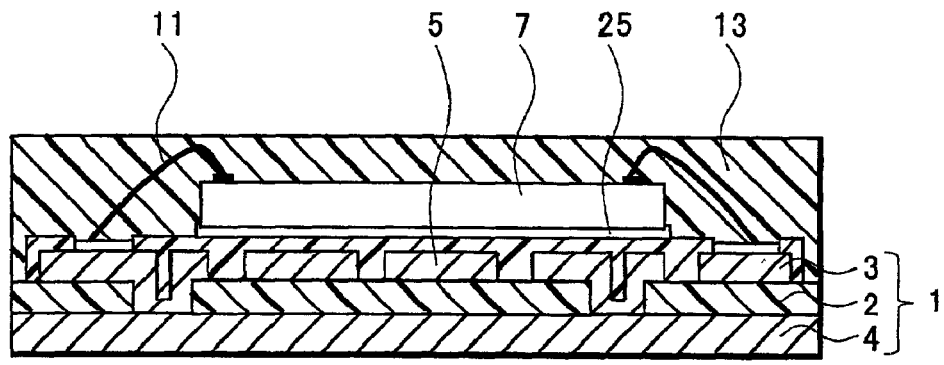
FIG. 7 is a sectional view describing a method for fabricating a circuit device according to the invention.

The sixth step according to the invention overcoats the first conductive path layer 5 and the semiconductor element 7 with a sealing resin layer 13 as shown in FIG. 7.

The insulation resin sheet 1 is set in a molding apparatus and is used for resin molding. Transfer molding, injection molding, coating, dipping, etc., may be possible as the molding method. However, in consideration of mass production, the transfer molding and injection molding are favorable.

Although, in this step, it is necessary that the insulation resin sheet 1 is flatly brought into contact with the lower metal die of a mold cavity, the second conductive layer 4, which is thick, functions like this. In addition, until contraction of the sealing resin layer 13 is completely finished after the insulation resin sheet 1 is taken out from the mold cavity, the flatness of a package can be maintained by the second conductive layer 4.

That is, the role of the mechanical support of the insulation resin sheet 1 is retained by the second conductive layer 4.

Figure 8:
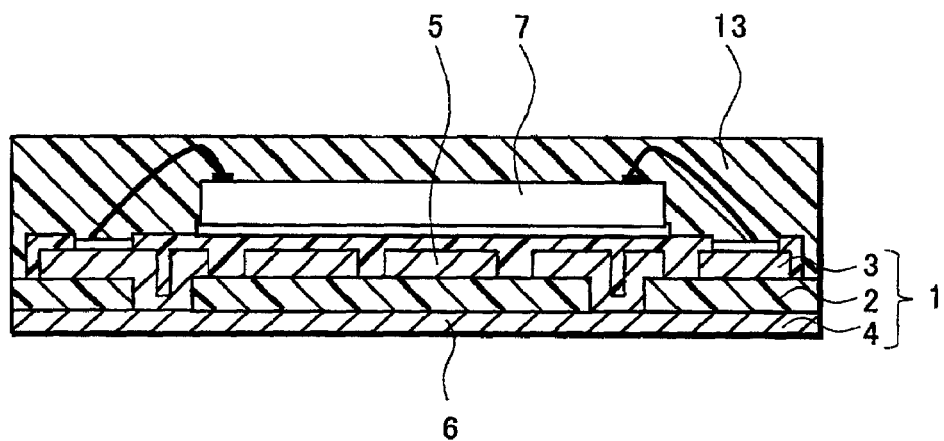
FIG. 8 is a sectional view describing a method for fabricating a circuit device according to the invention.
Figure 9:
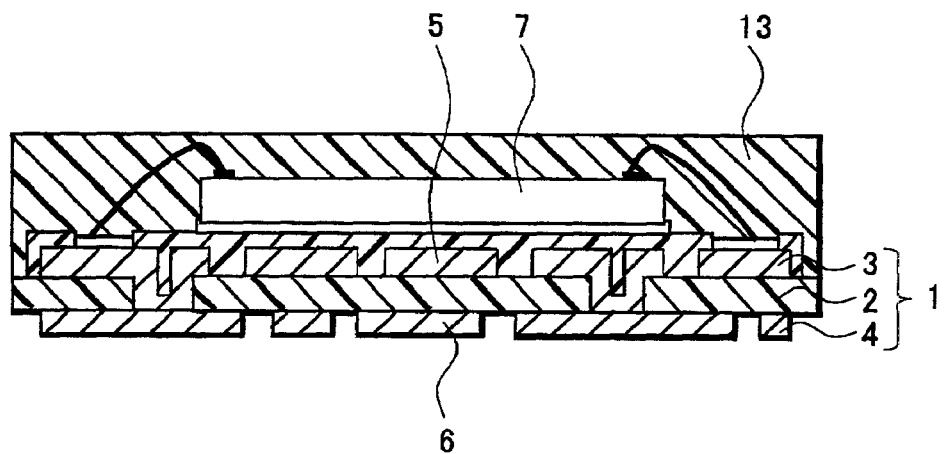
FIG. 9 is a sectional view describing a method for fabricating a circuit device according to the invention.

The seventh step according to the invention forms, as shown in FIG. 8 and FIG. 9, the second conductive path layer 6 by etching the second conductive layer 4 to an appointed pattern after etching the entire surface of the second conductive layer 4 so as to become thin.

As shown in FIG. 8, the entire surface of the second conductive layer 4 is etched so as to become thin without any mask. The etching may be chemical etching using ferric chloride or cupric chloride, and the thickness of the second conductive layer 4 is uniformly made thin to approx. 35 μm, which is almost half the initial thickness of 70 through 200 µm. At this time, it is possible to eliminate damage and scratches or scratches, to which the second conductive layer 4 was subjected in the preceding steps.

Continuously, as shown in FIG. 9, the second conductive layer 4 is overcoated with photo-resist of an appointed pattern, and forms the second conductive path layer 6 by chemical etching. Since the second conductive layer 4 is made thin in this step, it becomes possible to achieve a fine pattern which is 50 µm or less. The second conductive path layers 6 are arrayed with fixed intervals as shown in FIG. 2, and are individually electrically connected to each other via the first conductive path layer 5 and multi-layer connecting means 12, thereby achieving a multi-layered connection structure. Also, as necessary, the second conductive path layers 6 to cross the first conductive path layers 5 at blank portions may be formed.

The eighth step according to the invention forms, as shown in FIG. 1, external electrodes 14 at appointed points of the second conductive path layer 6.

The second conductive path layer 6 has portions, at which the external electrodes 14 are formed, exposed, and almost all the portions of the second conductive path layer 6 are overcoated with an overcoating resin layer 15 by screen-printing of epoxy resin, etc., which is dissolved by a solvent. Next, external electrodes 14 are simultaneously formed at the exposed portions by reflowing of solder or screen printing of solder cream.

Finally, since a number of circuit devices are formed on the insulation resin sheet 1 in the form of matrices, the sealing resin layer 13 and insulation resin sheet 1 are diced and are separated for individual circuit devices.

Figure 11:
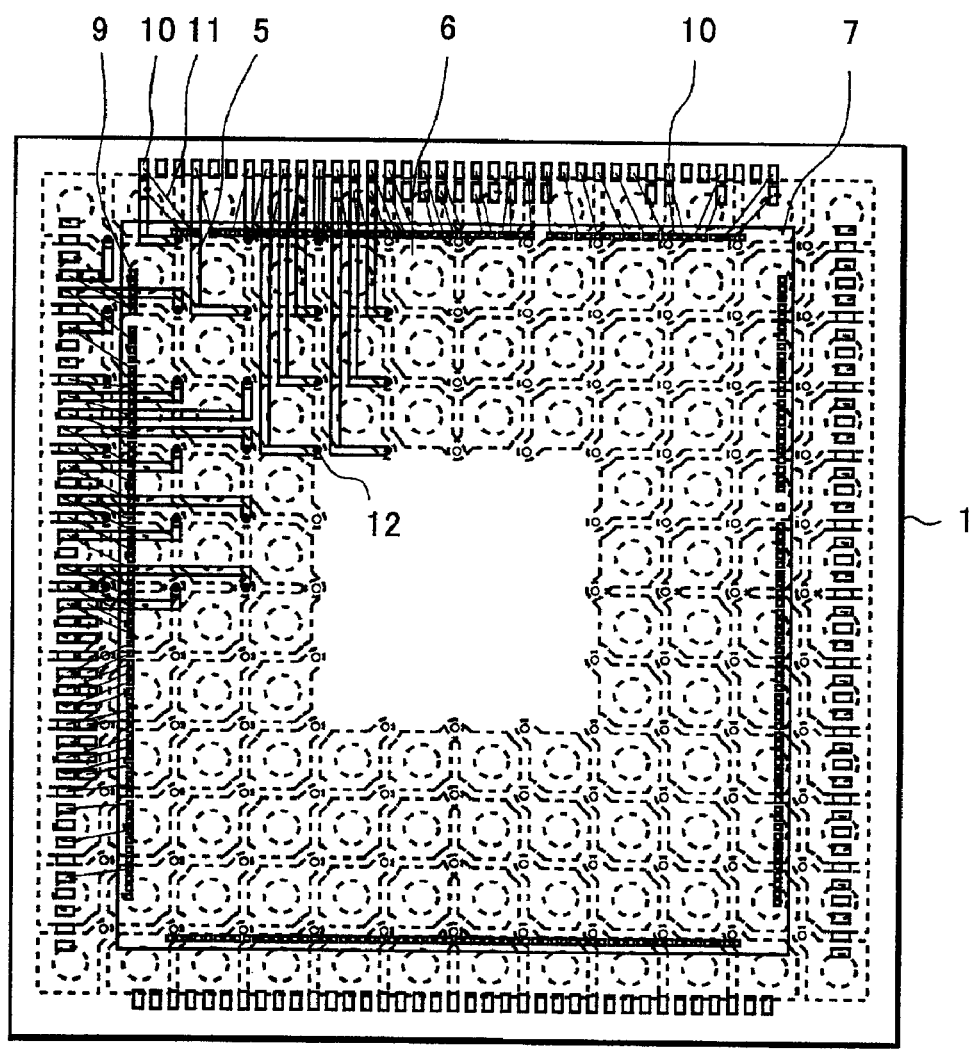
FIG. 11 is a plan view describing a circuit device fabricated on the basis of the invention.

With reference to FIG. 11, a description is given of a circuit device according to the embodied method of the invention. First, a pattern shown with solid lines is the first conductive path layer 5, and a pattern shown with dashed lines is the second conductive path layer 6. Bonding pads 10 are provided at the periphery of the semiconductor element 7 so as to surround the same on the first conductive path layer 5, and some of the pads are provided in two stages so as to correspond to a semiconductor element 7 having multiple pads. The bonding pads 10 are connected to electrode pads 9, to which the semiconductor elements 7 correspond, by bonding wires 11. A number of first conductive path layers 5 of a fine pattern extend below the semiconductor element 7 from the bonding pads 10, and are connected to the second conductive path layers 6 by multi-layer connecting means 12 shown by a black circle. In addition, a fine pattern can be formed on the second conductive path layers 6, and it is possible to form a further number of external electrodes 14.

In such a structure, even a semiconductor element having 200 or more pads is caused to extend to an appointed second conductive path layer 6, which is finely patterned by using a fine pattern of the first conductive path layer 5, by means of a multi-layer connection structure, wherein connections from the external electrodes 14 secured on the second conductive path layers 6 to a peripheral circuit can be carried out.

Figure 10:
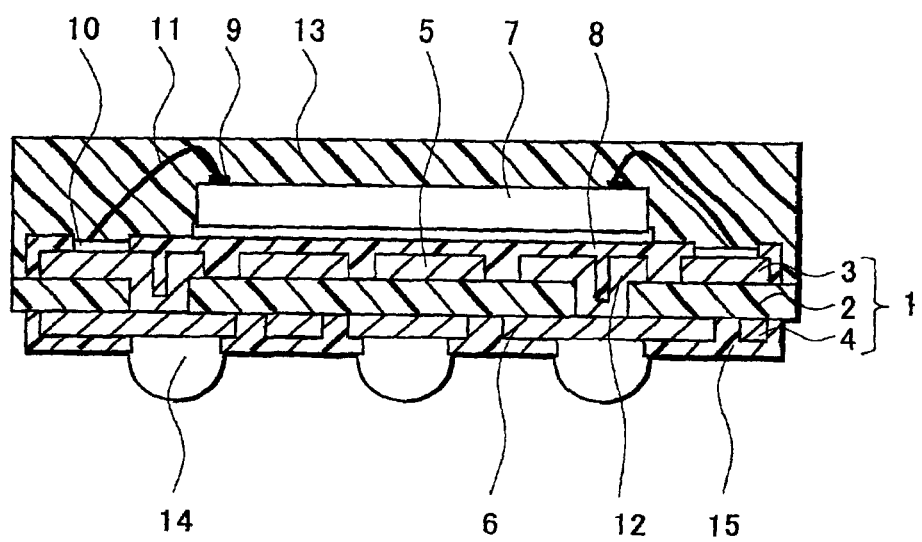
FIG. 10 is a sectional view describing a method for fabricating a circuit device according to the invention.
Figure 12:
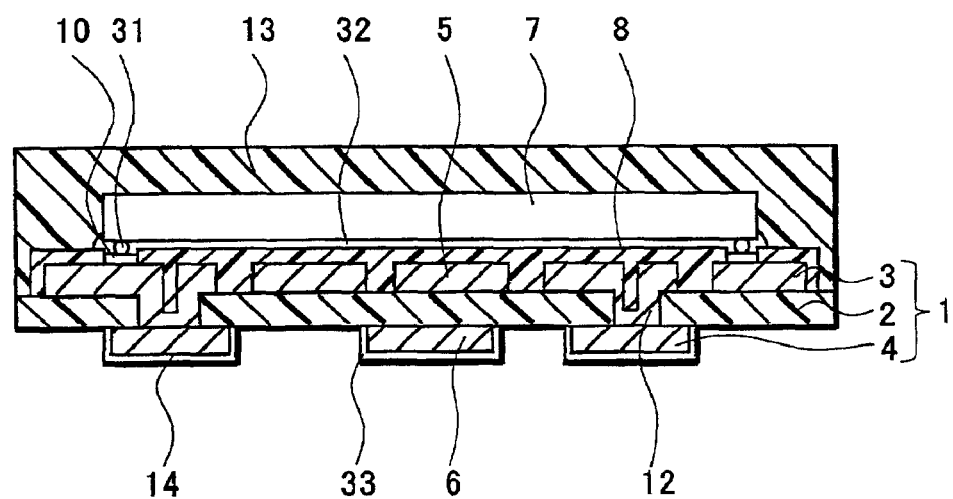
FIG. 12 is a sectional view describing a method for fabricating a circuit device according to the invention.
Figure 13:
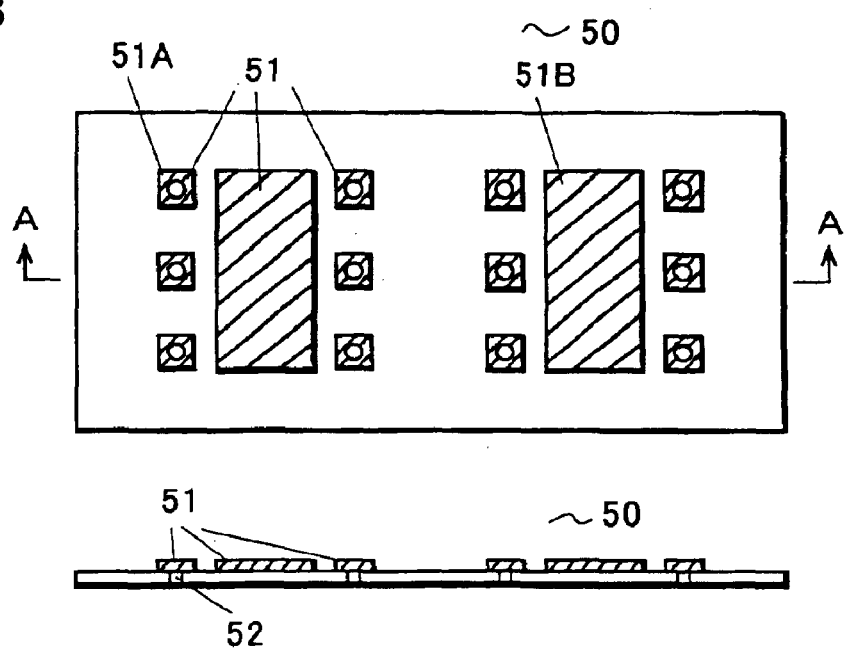
FIG. 13 is a view describing a method for fabricating a semiconductor according to prior arts.
Figure 14:
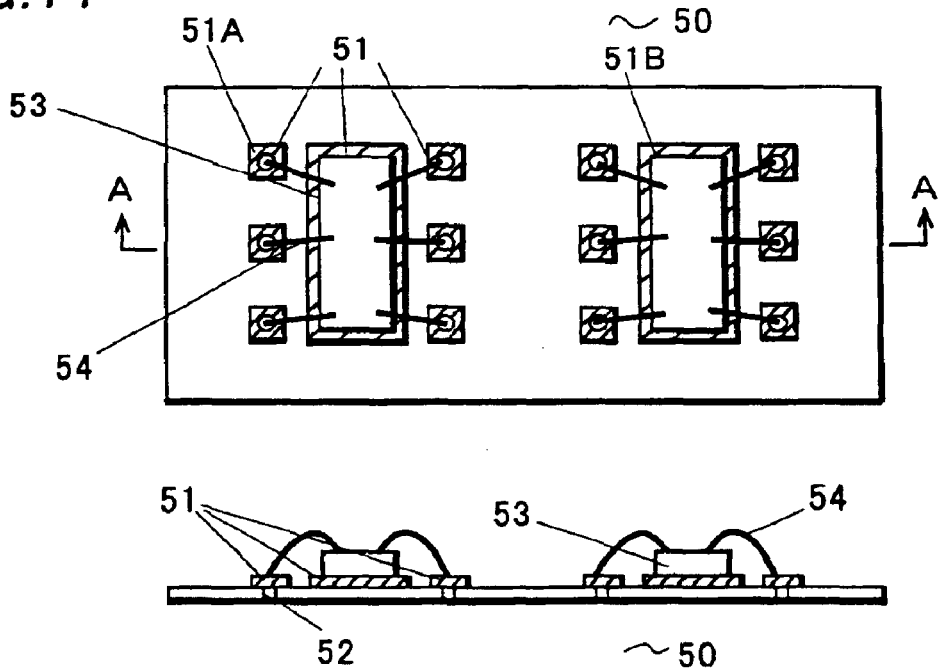
FIG. 14 is a view describing a method for fabricating a semiconductor according to prior arts.
Figure 15A:
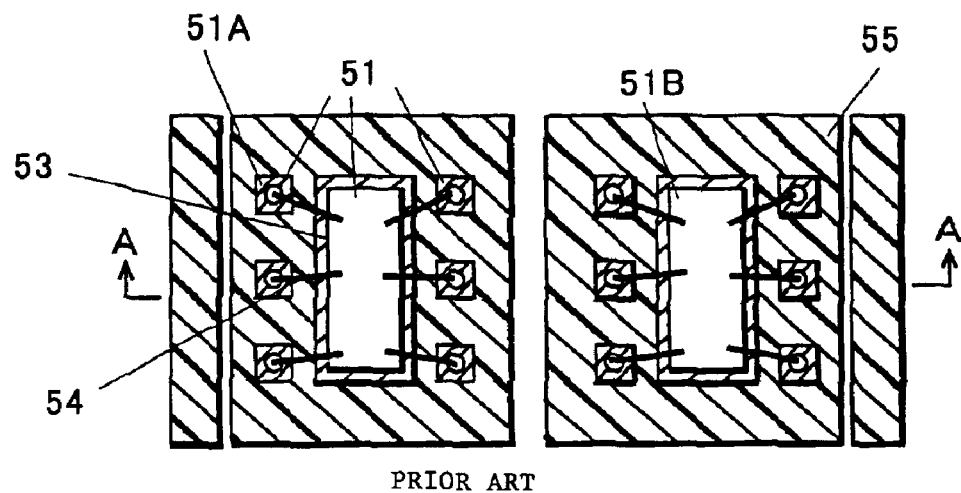
FIGS. 15A,15B and 15C are views describing a method for fabricating a semiconductor according to prior arts.
Figure 15B:
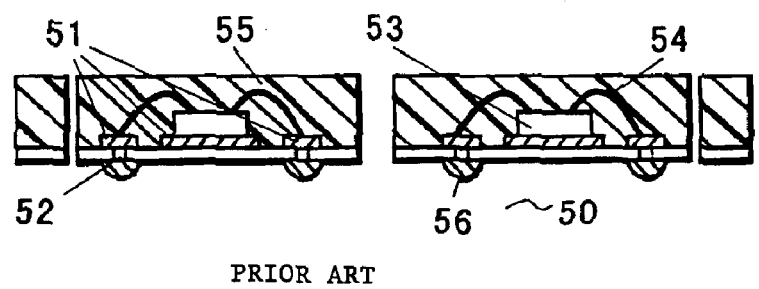
Figure 15C:
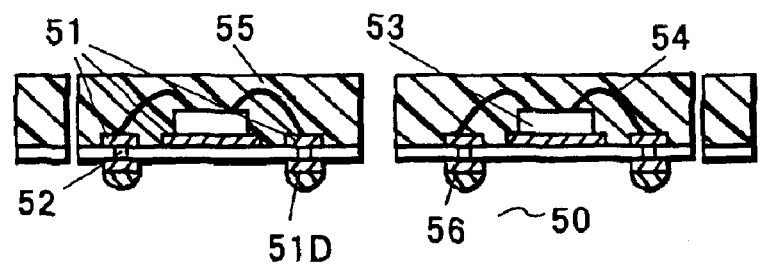
Figure 16:
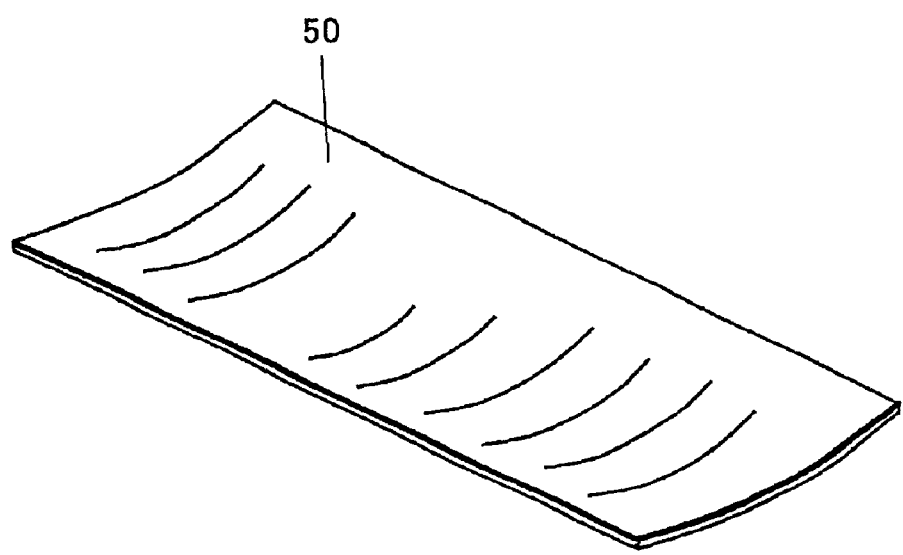
FIG. 16 is a view describing a prior art flexible sheet.

FIG. 12 shows a structure in which a semiconductor element 7 is assembled with its face down. Parts which are similar to those in FIG. 10 are given the same reference numbers. A bump electrode 31 is provided at the semiconductor element 7, and the bump electrode 31 is connected to a bonding pad 10. Under-filling resin 32 is filled in the gap between the overcoat resin 8 and the semiconductor element 7. Bonding wires can be removed in this structure, and the thickness of the sealing resin layer 13 can be made thinner. Also, the external electrodes 14 can be achieved by a bump electrode in which the second conductive layer 4 is etched, and the surface thereof is overcoated with a gold- or palladium-plated layer 33.

What is claimed is:

1. A method for fabricating a circuit device, comprising the steps of:
   preparing an insulation resin sheet for which a first conductive layer and a second conductive layer are adhered to each other by insulation resin;
   forming through holes in said first conductive layer and said insulation resin at appointed points of said insulation resin sheet, and selectively exposing the rear side of said second conductive layer;
   forming multi-layer connecting means in said through holes and electrically connecting said first conductive layer and said second conductive layer;
   etching said first conductive layer to an appointed pattern and forming a first conductive path layer;
   adhering and fixing semiconductor elements by electrically insulating the same on said first conductive path layer;
   overcoating said first conductive path layer and said semiconductor elements with a sealing resin layer;
   etching said second conductive layer to an appointed pattern after etching the entire surface thereof so as to become thin, and forming a second conductive path layer; and
   forming external electrodes at appointed points of said second conductive path layer.

2. The method for fabricating a circuit device according to claim 1, wherein said first conductive layer and said second conductive layer are formed of copper foil.

3. The method for fabricating a circuit device according to claim 1, wherein said first conductive layer is formed to be thinner than said second conductive layer, and said first conductive layer is finely patterned.

4. The method for fabricating a circuit device according to claim 1, wherein said second conductive layer is formed to be thicker than said first conductive layer and mechanically supports said first conductive layer until the step of overcoating the same with said sealing resin layer is completed.

5. The method for fabricating a circuit device according to claim 1, wherein said first conductive layer is mechanically supported by said sealing resin layer after the step of overcoating the same with said sealing resin layer.

6. The method for fabricating a circuit device according to claim 1, wherein said through holes are prepared by laser etching of said insulation resin using said first conductive layer as a mask after etching said first conductive layer.

7. The method for fabricating a circuit device according to claim 6, wherein said laser etching utilizes a carbonic acid gas laser.

8. The method for fabricating a circuit device according to claim 1, wherein said multi-layer connecting means is formed in said through holes and on the surface of said first conductive layer by non-electrolytic or electrolytic plating of a conductive metal.

9. The method for fabricating a circuit device according to claim 1, wherein said first conductive path layer is overcoated with overcoating resin with appointed portions thereof not overcoated after said first conductive path layer is formed.

10. The method for fabricating a circuit device according to claim 9, wherein a layer plated by gold or silver is formed at portions exposed from said overcoating resin of said first conductive path layer.

11. The method for fabricating a circuit device according to claim 9, wherein said semiconductor elements are adhered to and fixed on said overcoating resin.

12. The method for fabricating a circuit device according to claim 10, wherein electrodes of said semiconductor elements and said gold- or silver-plated layer are connected to each other by bonding wires.

13. The method for fabricating a circuit device according to claim 1, wherein said sealing resin layer is formed by a transfer mold.

14. The method for fabricating a circuit device according to claim 1, wherein said second conductive layer is made thin by uniformly etching the entire surface thereof without any mask.

15. The method for fabricating a circuit device according to claim 1, wherein almost all of the said second conductive path layer is overcoated with overcoating resin.

16. The method for fabricating a circuit device according to claim 1, wherein said external electrodes have solder adhered thereto by screen printing of solder and are formed by being heated and dissolved.

17. The method for fabricating a circuit device according to claim 1, wherein said external electrodes are formed by reflowing of solder.

18. The method for fabricating a circuit device according to claim 1, wherein said external electrodes are formed with the surface thereof plated with gold or palladium by etching said second conductive layer to an appointed pattern.

* * * * *